(12) United States Patent
Schwartz et al.

(10) Patent No.: US 9,060,414 B2
(45) Date of Patent: Jun. 16, 2015

(54) SOLID STATE STORAGE MEDIA CARTRIDGE

(71) Applicant: International Business Machines Corporation, Armonk, NY (US)

(72) Inventors: Stephen L. Schwartz, Tucson, AZ (US); Daniel J. Winarski, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 111 days.

(21) Appl. No.: 13/895,024

(22) Filed: May 15, 2013

(65) Prior Publication Data

US 2014/0339131 A1 Nov. 20, 2014

(51) Int. Cl.
| | |
|---|---|
| *G11B 23/027* | (2006.01) |
| *H05K 5/00* | (2006.01) |
| *G11B 23/037* | (2006.01) |
| *G11B 23/04* | (2006.01) |

(52) U.S. Cl.
CPC .............. *H05K 5/00* (2013.01); *Y10T 29/49826* (2015.01); *G11B 23/037* (2013.01); *G11B 23/044* (2013.01); *G11B 23/049* (2013.01)

(58) Field of Classification Search
CPC .. G11B 23/107; G11B 23/037; G11B 23/044; G11B 23/08728; G11B 23/027; G11B 23/04; G11B 23/113; G11B 23/049; G11B 23/06; G11B 23/07; G11B 23/32; G11B 23/34; G11B 23/08714; H05K 5/00; Y10T 29/49826
USPC ............ 360/132; 242/332, 332.4, 332.8, 348, 242/347
See application file for complete search history.

(56) References Cited

U.S. PATENT DOCUMENTS

| | | | |
|---|---|---|---|
| 6,311,916 B1 * | 11/2001 | Johnson et al. ............ | 242/332.8 |
| 6,856,486 B2 * | 2/2005 | Onmori et al. ................ | 360/132 |
| 6,867,942 B2 | 3/2005 | Albrecht et al. | |
| 7,221,540 B2 * | 5/2007 | Onmori et al. ................ | 360/132 |
| 7,384,700 B2 * | 6/2008 | Hayakawa ................. | 428/839.6 |
| 7,471,487 B2 * | 12/2008 | Onmori et al. ................ | 360/132 |
| 7,530,515 B2 * | 5/2009 | Battles et al. .............. | 242/332.4 |
| 7,548,418 B2 | 6/2009 | Martin et al. | |

(Continued)

FOREIGN PATENT DOCUMENTS

| | | | | |
|---|---|---|---|---|
| GB | 1366493 A | * | 9/1974 | |
| JP | 05151743 A | * | 6/1993 | |
| JP | 09035448 A | * | 2/1997 | |

OTHER PUBLICATIONS

ECMA, "Data Interchange on 12,7 mm 384-Track Magnetic Tape Cartridges-Ultrium-1 Format", Standard ECMA-319, Jun. 2001, Switzerland http://www.ecma-international.org/publications/standards/Ecma-319.htm.

(Continued)

*Primary Examiner* — Will J Klimowicz
(74) *Attorney, Agent, or Firm* — Nolan Lawrence

(57) ABSTRACT

According to embodiments of the invention, a tape cartridge adapted to house solid state storage may be provided. The cartridge may include a cartridge housing. The cartridge may also include a reel located within the cartridge housing, wherein the reel includes one or more radial grooves adapted to hold one or more solid state storage elements. According to other embodiments, the cartridge may also include one or more solid state storage elements held within the reel, wherein each solid state storage element includes a first electrical connector.

18 Claims, 3 Drawing Sheets

(56) References Cited

U.S. PATENT DOCUMENTS

| | | | |
|---|---|---|---|
| 7,861,011 | B2 | 12/2010 | Kottomtharayil et al. |
| 2002/0144044 | A1 | 10/2002 | Moon et al. |
| 2003/0135672 | A1 | 7/2003 | Yip et al. |
| 2004/0004789 | A1* | 1/2004 | Watanabe et al. ............ 360/132 |
| 2004/0181388 | A1 | 9/2004 | Yip et al. |
| 2005/0152670 | A1* | 7/2005 | Skaar .............................. 386/46 |
| 2005/0214525 | A1* | 9/2005 | Ohno ............................ 428/327 |
| 2007/0177304 | A1* | 8/2007 | Onmori et al. ................ 360/132 |
| 2011/0015778 | A1 | 1/2011 | Edling et al. |
| 2012/0158171 | A1 | 6/2012 | Day et al. |
| 2013/0003287 | A1 | 1/2013 | Fletcher et al. |

OTHER PUBLICATIONS

Belkin USB Extension Cable, Type A (M-F), Black, 3ft http://www.pcconnection.com/IPA/Shop/Product/Detail.htm?sku=8656637&cac=Result, (printed May 15, 2013).

Lexar 128GB Echo MX Backup USB Flash Drive http://www.pc-connection.com/IPA/Shop/Product/Detail.htm?sku=12724330&cac=Result, (printed May 15, 2013).

PC Connection USB 2.0 Extension Cable, Type-A Male to Female, Black, 6ft http://www.pcconnection.com/IPA/Shop/Product/Detail.htm?sku=473148&cac=Result, (printed May 15, 2013).

\* cited by examiner

SOLID STATE STORAGE MEDIA CARTRIDGE

TECHNICAL FIELD

The field of the invention relates generally to data storage media, and more specifically, to housing solid state storage in tape cartridges.

BACKGROUND

Computer systems typically include a combination of software, such as programs and data, and hardware, such as semiconductors, transistors, chips, circuit boards, data storage media, and processors. An example of data storage media is magnetic tape. Typically magnetic tape is wound on a reel, which may be located within a portable cartridge. Another example of data storage media is solid state storage (SSS). Unlike magnetic tape which stores data magnetically, solid state storage stores data electronically.

SUMMARY

According to embodiments of the invention, a tape cartridge adapted to house solid state storage may be provided. The cartridge may include a cartridge housing. The cartridge may also include a reel located within the cartridge housing, wherein the reel includes one or more radial grooves adapted to hold one or more solid state storage elements. According to other embodiments, the cartridge may also include one or more solid state storage elements held within the reel, wherein each solid state storage element includes a first electrical connector.

According to embodiments of the invention, a method of assembly of a tape cartridge adapted to house solid state storage may be provided. The method may include providing a reel adapted to hold one or more solid state storage elements. The method may also include placing one or more solid state storage elements within the reel, wherein each solid state storage element includes a first electrical connector. The method may also include placing the reel within a cartridge housing. According to other embodiments, the method may also include mating the cartridge housing to a cartridge receiver, wherein the cartridge receiver includes a second electrical connector adapted to electrically connect to the first electrical connector, and a mechanism adapted to rotate the reel.

DETAILED DESCRIPTION

Data storage cartridges, such as tape cartridges, typically include a type of data storage media, such as magnetic tape, and are usually inserted into a separate data storage drive so that data may be read from and/or written to the data storage medium. Such cartridges are convenient means of storing large quantities of data which are accessed occasionally. They are particularly useful in automated data storage libraries which can contain large numbers of the cartridges in a storage system. The storage library may also contain an automated retrieval system to access a cartridge when needed and deliver the cartridge to the data storage drive. Historically, these data storage libraries were developed with cartridges containing magnetic tape, since magnetic tape was the most economical data storage medium at the time. However, a disadvantage of magnetic tape is the linear fashion in which the tape is read from and written to, i.e. the tape must be wound back and forth to access different section of data. Other data storage medium, such as solid state storage, allow for quick read/write capability to the entire data storage. Due to advances in the technology of solid state storage, it has become economical to use solid state storage in place of magnetic tape. However, in the interest of continuing to utilize already existing data storage library structures, it may be desirable to adapt the same or similar cartridges which previously housed magnetic tape, to house solid state storage.

Embodiments of the invention provide a tape cartridge adapted to house solid state storage. The cartridge may include an upper and lower cartridge housing. The cartridge may contain a reel similar to a reel designed to hold magnetic tape. The reel may have a number of radial grooves or slots designed to hold a solid state storage element, such as a universal serial bus (USB) flash drive. Each solid state storage element may include an electrical connector protruding outward from the reel. The cartridge housing may also include a means to access the connectors of the solid state storage elements in order for an external electrical connector to be inserted into the cartridge and connected to the solid state storage elements. The reel may be rotated in order for all of the solid state storage elements within the reel to be accessed by the external electrical connector.

Figure 1:
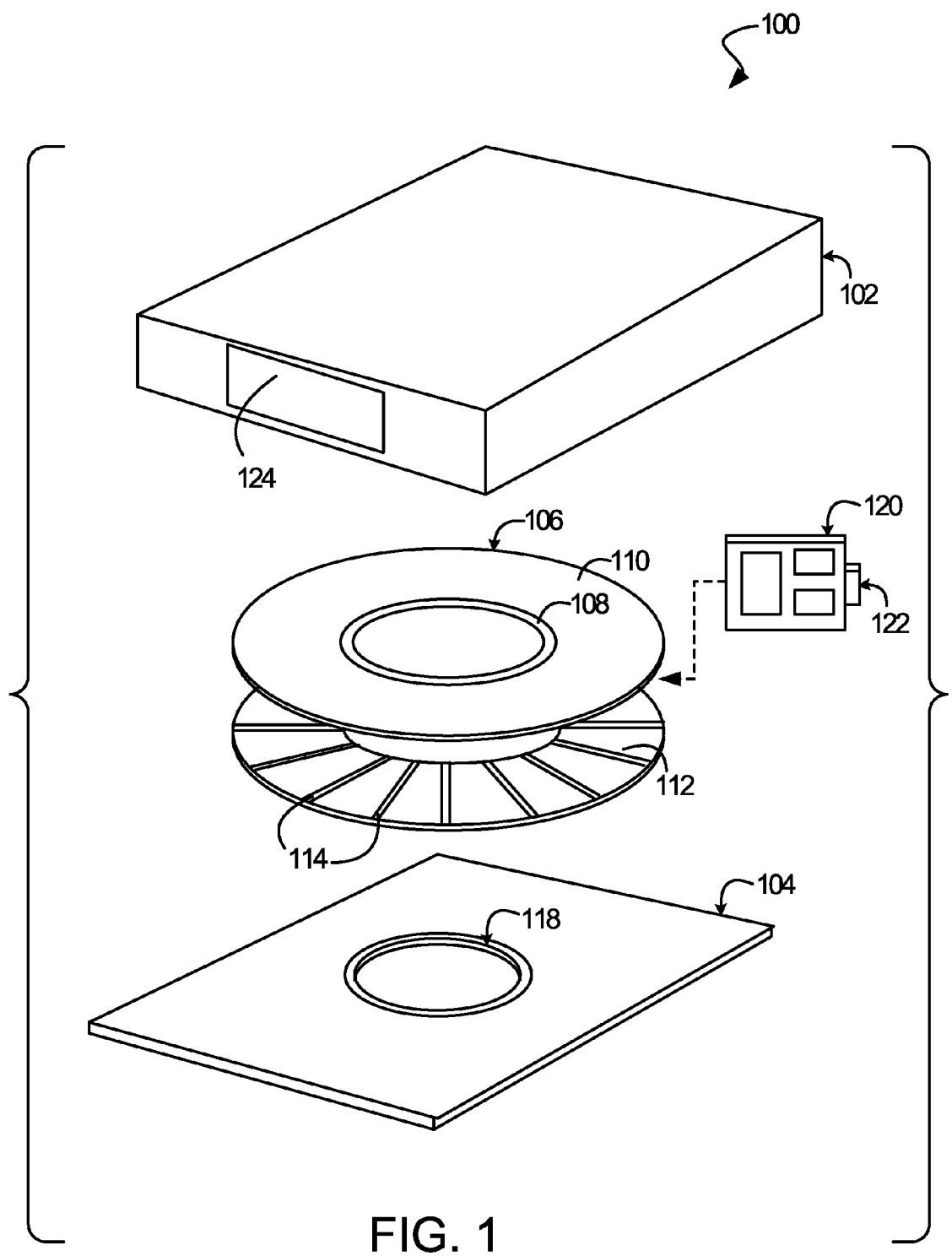
FIG. 1 is an exploded, isometric view of a tape cartridge adapted to house solid state storage, according to various embodiments of the invention.

Referring to the drawings, wherein like numbers denote like parts throughout the several views, FIG. 1 is an exploded, isometric view of a tape cartridge 100 adapted to house solid state storage, according to various embodiments of the invention. The cartridge 100 may include an upper housing 102, a lower housing 104, a reel 106, and any number of solid state storage elements 120. The upper housing 102 and lower housing 104 may be similar to housing used in a cartridge which houses a magnetic tape storage medium. The reel 106 may also be a reel similar to a reel designed to hold the magnetic tape storage medium. The reel 106 may include a hollow cylindrical core 108, an upper flange 110 and a lower flange 112. The reel 106 may also include matching slots or grooves 114 in the opposing faces of the upper flange 110 and the lower flange 112. In various embodiments, the upper housing 102 and the lower housing 104 may be cylindrically shaped. In even further embodiments, if the upper housing 102 is cylindrically shaped, the lower flange 112 may function as a lower housing.

Each set of grooves 114 may hold a solid state storage element 120. Each solid state storage element 120 may include an electrical connector 122. An example of a solid state storage element is a USB flash drive. Other examples of a solid state storage elements include NAND flash memory, read-only-memory (ROM), and electrically-erasable, programmable, read-only-memory (EEPROM). The elements 120 may be inserted into the grooves 114 of the reel 106 so that the connector 122 is directed away from the center of the reel 106. Each set of grooves 114 may contain a retention device (not shown), such as a clip or magnet, which may be disengaged in order to remove the solid state storage element 120. In various embodiments, a part of the retention device may be located on the reel 106 and a corresponding part may be on the solid state storage element 120. For example, if the retention device is two magnets, then one magnet may be located on the outer surface of the cylindrical core 108, and another magnet may be located on the surface of the solid state storage element 120 which faces the outer surface of the cylindrical core when the solid state storage element is placed into the grooves 114 of the reel 106. In other embodiments, the retention device may be a clip located on the outer surface of the cylindrical core 108, and a tab located on the surface of the solid state storage element 120 which faces the outer surface of the cylindrical core and engages the clip when the solid state storage element is placed into the grooves 114 of the reel 106.

The upper housing 102 may include an aperture 124 through which an external connector may be inserted in order to connect to the connector 122 of the solid state storage element 120. In various embodiments, the aperture 124 may be of large enough to facilitate the removal and replacement of the solids state storage element 120. In an assembled position, the reel 106 may include the ability to be rotated within the cartridge 100 by an external mechanism which enters the cartridge 100 through a hole 118 in the lower housing 104. By selectively rotating the reel 106, each solid state storage element 120 may be aligned with the aperture 124 so that an external connector may be connected to it. Each set of grooves 114 and each solid state storage element 120 may have a form of individual labeling, such as a barcode, to enable identification of each solid state storage element 120 and its location. A barcode may also be located on any surface of the reel 106, and each set of grooves 114 may have its own barcode to enable identification. A barcode reader (not shown) may be located with the cartridge 100 or it may be located outside the cartridge 100 and read the barcodes through the aperture 124. The barcode may also serve to ensure proper alignment of the reel 106 so that each solid state storage element 120 may be properly accessed.

Figure 2:
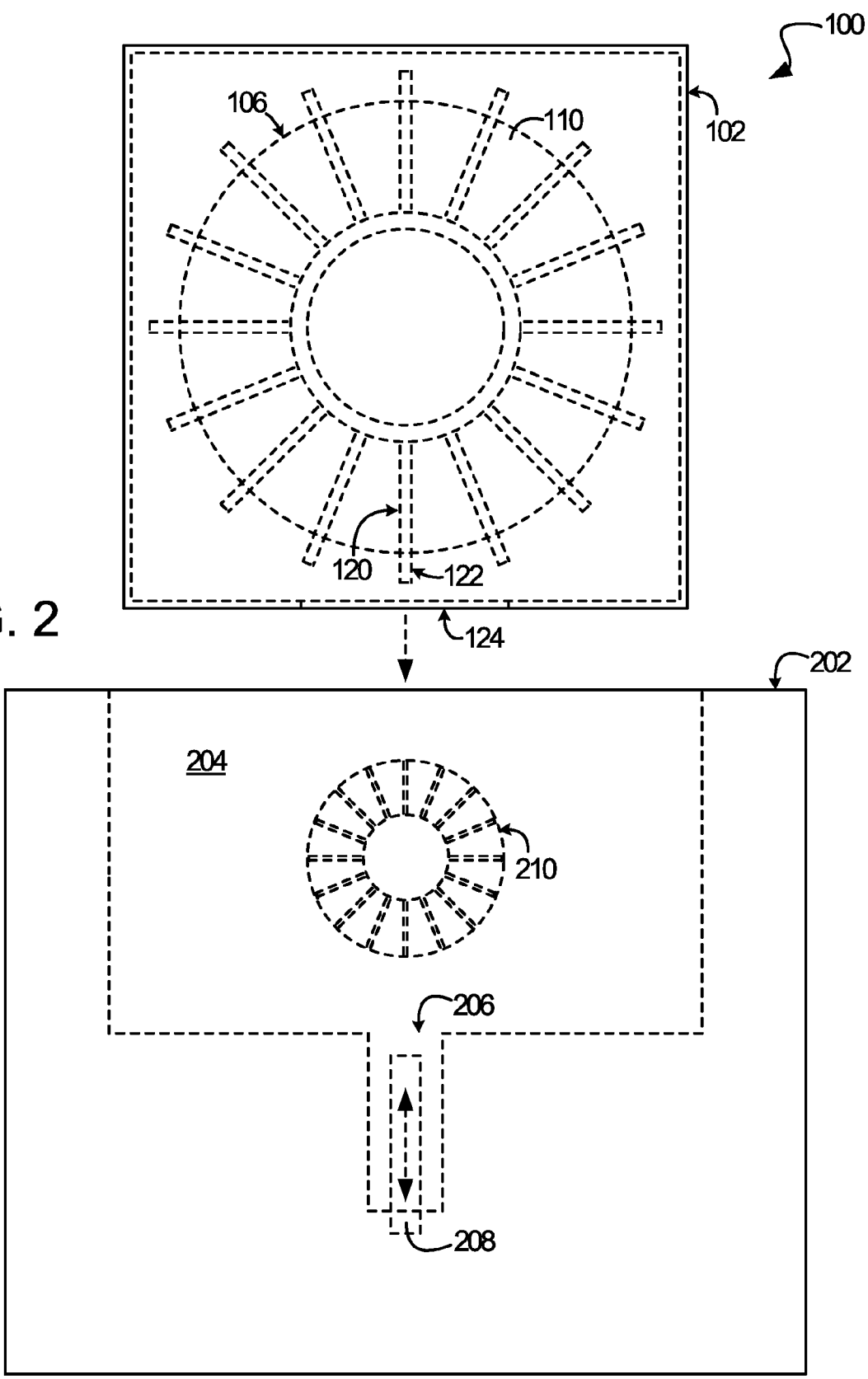
FIG. 2 is a top view of the cartridge of FIG. 1 and a cartridge receiver, according to various embodiments of the invention.

FIG. 2 is a top view of the cartridge 100 and a cartridge receiver 202, according to various embodiments of the invention. As in FIG. 1, the cartridge 100 may include the housing 102, the reel 106, one or more solid state storage elements 120, connector 122 on each solid state storage element 120, and the aperture 124. The cartridge receiver 202 may be a data storage drive and may include a main recess 204 for receiving a portion of the cartridge 100 in a mated position. The receiver 202 may also include a second recess 206 which contains an electrical connector 208. The electrical connector 208 may correlate to the electrical connector 122 of the solid state storage element 120. The electrical connector 208 may also be adapted to extend and retract in a direction towards and away from the cartridge 100. When the cartridge 100 is mated to the receiver 202, the connector 208 may telescope through the aperture 124 in order to connect to the connector 122 of the solid state element 120 nearest the aperture 124. The receiver 202 may also include a mechanism 210 adapted to rotate the reel 106 when the cartridge 100 and the receiver 202 are in a mated position. An example of a mechanism 210 may include a DC stepper motor with a clutch which engages the reel 106. By rotating the reel 106 with the mechanism 210, any of solid state elements 120 may be positioned to allow the connector 208 to be connected to the connector 124 of the solid state elements 120.

Figure 3:
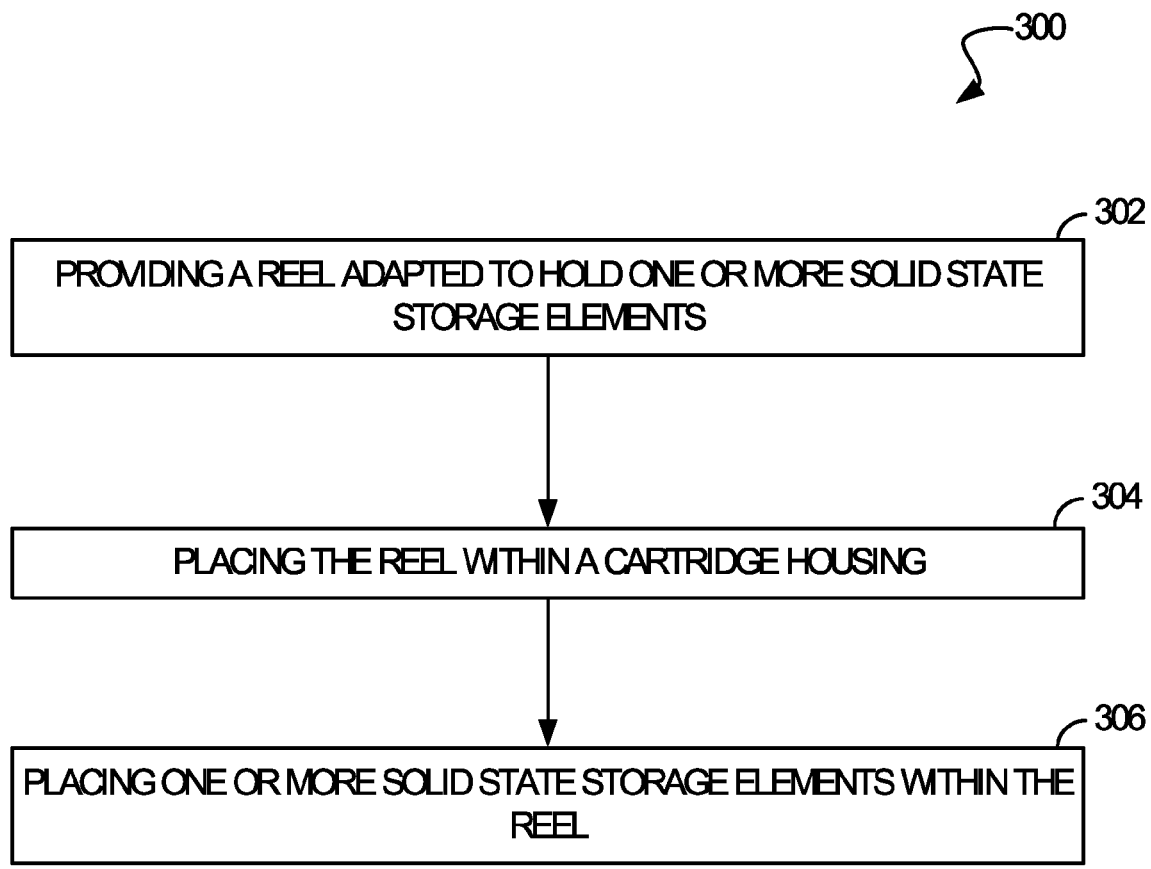
FIG. 3 is a flowchart of a method of assembly of a cartridge adapted to house solid state storage, according to various embodiments of the invention.

FIG. 3 is a flowchart of a method of assembly 300 of a cartridge adapted to house solid state storage, according to various embodiments of the invention. Block 302 may contain the operation of providing a reel adapted to hold one or more solid state storage elements. The reel may be the reel 106 and may be adapted to hold any number of solid state storage elements such as the solid state element 120. As previously mentioned, in various embodiments, the solid state storage elements may be placed within radial grooves of the reel. In other embodiments the reel may be solid with radial slots adapted to hold a solid state storage element in each slot.

Block 304 may contain the operation of placing the reel within a cartridge housing. The cartridge housing may consist of an upper and lower housing such as the cartridge 100. The cartridge housing may have an aperture such as the aperture 124 located in a position so as to allow an external connector to enter the cartridge housing and connect to a connector of a solid state storage element positioned nearest to the aperture. In various embodiments, the method of assembly 300 may include inserting the cartridge into a cartridge receiver. The cartridge receiver may be the cartridge receiver 202. As previously mentioned, the cartridge receiver may have a recess which holds an electrical connector adapted to mate with the electrical connectors of the solid state storage elements.

Block 306 may contain the operation of placing one or more solid state storage elements within the reel. The solid state storage elements may be the solid state storage elements 120 or any other similar solid state storage element. Any number of solid state storage elements may be placed within the reel. Each solid state storage element may include an electrical connector such as the electrical connector 122. Examples of electrical connectors used in conjunction with solid state storage elements are USB 1, USB 2.0, and USB 3.0

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. An assembly comprising:
  a cartridge housing having an opening for the receipt of a media reader;
  a reel located within the cartridge housing, the reel including a core located central to the reel, the reel further including one or more linear grooves adapted to hold one or more solid state storage elements, the linear grooves extending outward along the reel and away from the core;
  one or more solid state storage elements held within the reel between the linear grooves, wherein each solid state storage element includes a first electrical connector, wherein the electrical connector is shaped to physically contact a media reader that is inserted through the opening of the cartridge housing, and
  the reel being rotatable about a rotational axis of the core in relation to the cartridge housing such that each of the linear grooves is alignable with the opening of the cartridge housing.
2. The assembly of claim 1, wherein the reel includes one or more barcodes identifying the one or more linear grooves.
3. The assembly of claim 1, wherein the one or more solid state storage elements are held within the reel by a retention device including at least one magnet.

4. The assembly of claim 1, wherein the one or more solid state storage elements are held within the reel by a retention device including at least one clip.

5. The assembly of claim 1, wherein at least one of the solid state storage elements is a USB flash drive.

6. The assembly of claim 1, further comprising a cartridge receiver adapted to receive the cartridge housing in a mated position.

7. The assembly of claim 6, wherein the cartridge receiver includes a second electrical connector adapted to physically and electrically connect to the first electrical connector of one of the one or more solid state storage elements in a mated position.

8. The assembly of claim 6, wherein the cartridge receiver includes a mechanism adapted to selectively rotate the reel.

9. A method of assembly comprising:
providing a reel including a core located central to the reel, the reel also including one or more linear grooves adapted to hold one or more solid state storage elements, the linear grooves extending outward along the reel and away from the core;
placing the reel within a cartridge housing;
placing one or more solid state storage elements within the reel between the linear grooves, wherein each solid state storage element includes a first electrical connector, wherein the electrical connector is shaped to physically contact a media reader that is inserted through an opening of the cartridge housing; and
selectively aligning each of the linear grooves with the opening of the cartridge housing by rotating the reel about a rotational axis of the core in relation to the cartridge housing.

10. The method of claim 9, wherein the reel includes one or more barcodes identifying the one or more linear grooves.

11. The method of claim 9, wherein the one or more solid state storage elements are held within the reel by a retention device including at least one magnet.

12. The method of claim 9, wherein the one or more solid state storage elements are held within the reel by a retention device including at least one clip.

13. The method of claim 9, wherein at least one of the solid state storage elements is a USB flash drive.

14. The method of claim 9, further comprising mating the cartridge housing with a cartridge receiver.

15. The method of claim 14, wherein the cartridge receiver includes a second electrical connector adapted to physically and electrically connect to the first electrical connector of one of the one or more solid state storage elements in a mated position.

16. The method of claim 14, wherein the cartridge receiver includes a mechanism adapted to selectively rotate the reel.

17. A method comprising:
providing a reel, the reel including a first pair of parallel linear grooves extending outwardly from a central core of the reel in a first direction, and further including a second pair of parallel linear grooves extending outwardly form the central core in a second direction, the second direction at an angle from the first direction relative to the central core;
securing a first solid state storage element between the first pair of parallel linear grooves;
securing a second solid state storage element between the second pair of parallel linear grooves;
inserting the reel having the first and second solid state storage elements secured thereto within a cartridge housing, the cartridge housing having an aperture;
aligning the first solid state storage element with the aperture by performing a first rotational movement of the housed reel about a rotational axis of the central core;
physically and electrically connecting the aligned first solid state storage element to a media reader inserted through the aperture;
disconnecting the aligned first solid state storage element from the media reader;
aligning, subsequent to the disconnecting the aligned first solid state storage element from the media reader, the second solid state storage element with the aperture by performing a second rotational movement of the housed reel about the rotational axis of the central core; and
physically and electrically connecting the aligned second solid state storage element to the media reader inserted through the aperture.

18. The method of claim 17, wherein the reel includes a first barcode for identifying the first pair of parallel linear grooves, wherein the reel further includes a second barcode for identifying the second pair of parallel linear grooves.

* * * * *